(12) United States Patent
Guenter

(10) Patent No.: US 7,460,578 B2
(45) Date of Patent: Dec. 2, 2008

(54) ON-CHIP LENSES FOR DIVERTING VERTICAL CAVITY SURFACE EMITTING LASER BEAMS

(75) Inventor: James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 129 days.

(21) Appl. No.: 11/103,277

(22) Filed: Apr. 11, 2005

(65) Prior Publication Data
US 2006/0227844 A1 Oct. 12, 2006

(51) Int. Cl.
H01S 3/08 (2006.01)
(52) U.S. Cl. .................. 372/107; 372/101
(58) Field of Classification Search ......... 372/50.23, 372/50.124
See application file for complete search history.

(56) References Cited

U.S. PATENT DOCUMENTS

| | | | |
|---|---|---|---|
| 5,705,025 A * | 1/1998 | Dietrich et al. ........... 438/29 |
| 5,835,517 A * | 11/1998 | Jayaraman et al. ....... 372/50.124 |
| 6,069,905 A * | 5/2000 | Davis et al. ............. 372/50.124 |
| 2002/0003824 A1* | 1/2002 | Lo et al. ................. 372/50 |
| 2002/0039376 A1* | 4/2002 | Kim et al. ............... 372/50 |
| 2003/0006367 A1* | 1/2003 | Liess et al. .............. 250/221 |
| 2003/0007534 A1* | 1/2003 | Kanemaru et al. ....... 372/50 |
| 2003/0091084 A1* | 5/2003 | Sun et al. ................ 372/50 |
| 2004/0062479 A1* | 4/2004 | Capewell ................ 385/36 |
| 2005/0195882 A1* | 9/2005 | Wang et al. ............. 372/101 |
| 2006/0083283 A1* | 4/2006 | Kondo .................... 372/50.124 |

* cited by examiner

Primary Examiner—Minsun Harvey
Assistant Examiner—Sean Hagan
(74) Attorney, Agent, or Firm—Workman Nydegger

(57) ABSTRACT

An optical device includes a chip containing a Vertical Cavity Surface Emitting Laser (VCSEL) active region that produces a laser beam on a first axis. The VCSEL can further include a post having a central axis offset a distance from the first axis. A lens can be mounted on the post such that it bends the laser beam away from the first axis. Alternately, the chip can include multiple VCSEL active regions each of which produces a laser beam on a different axis. The chip can include a post having a central axis offset from the laser beam axes. A lens can be mounted on the post such that the lens bends the laser beams away from the central axis.

25 Claims, 4 Drawing Sheets

ON-CHIP LENSES FOR DIVERTING VERTICAL CAVITY SURFACE EMITTING LASER BEAMS

CROSS-REFERENCE TO RELATED APPLICATIONS

Not applicable.

BACKGROUND OF THE INVENTION

1. The Field of the Invention

Exemplary embodiments of the present invention relate to the field of laser optics, and, more specifically, to designs of Lens-on-Chip (LOC) and Lens-on-Post-on-Chip (LOPOC) Vertical Cavity Surface Emitting Lasers.

2. The Relevant Technology

Lasers have a wide range of applications in today's technological world. For example, lasers are used in data communications applications, in entertainment devices, as sensors, as measuring devices, and in a host of other applications. One type of laser used in these devices is the vertical cavity surface emitting laser (VCSEL). Over the years, the various devices that use VCSELs have become smaller and smaller. This has resulted in a technical challenge to engineers, who must design these components to be smaller and smaller, yet still perform to the same or better technical specifications.

One method used to miniaturize laser transmitters and laser transmission assemblies is to reduce the number of components. Another method is to make the various components themselves, smaller. For example, the beam of light that exits from a laser transmitter often needs to be focused or collimated. External lenses have been used for this purpose for many years. Recently, lens on chip (LOC) and lens on post on chip (LOPOC) technologies have been developed. LOC technology incorporates a polymer lens onto the laser chip during the wafer fabrication process. The fabrication process includes lithographically forming a region on the wafer to accept a polymer and subsequently placing the lens on the wafer using an inkjet or needle. LOPOC includes an additional polymer standoff to allow the lens to be raised from the surface of the laser chip, thus making it possible to achieve greater optical power. Previously, LOC and LOPOC were used to couple laser light from a VCSEL directly into a fiber, such as a fiber optic cable in a data communications network. This coupling was achieved on a single axis, the axis of the fiber optic cable and the axis of the light beam exiting from the VCSEL being co-linear.

One example of a basic LOPOC apparatus is shown in FIG. 1A and designated generally as reference numeral 100. Apparatus 100 includes a semiconductor emitter/detector 102. Semiconductor emitter/detector 102 can be, for example, a VCSEL, a laser beam detector, or both. Apparatus 100 further includes a polymer standoff or post 104 that maintains a lens 106 at a desired offset distance from the surface of semiconductor emitter detector 102. This allows a laser beam 108 to be focused on a desired point above apparatus 100. Alternately, or in addition to focusing the beam to a desired point, laser beam 108 can be focused on the detector via a portion of beam 108 that is reflected from lens 106.

Currently LOPOC devices only allow the beam to be directed in a straight line upward or downward, along the optical axis of the standoff and/or lens, i.e. on a single axis. However, to make the overall package smaller, it is sometimes desirable to tilt the beam or direct the beam to a point that is "off" this optical axis. FIG. 1B illustrates one prior art system used to tilt the laser beam, designated generally as reference numeral 150. System 150 includes a semiconductor emitter 152, such as a VCSEL, and a laser detector 154. An external lens 156 is used to focus a beam 158 towards a point 160 that is positioned off the optical axis of beam 158, i.e. on a different axis. A portion 162 of beam 158 is reflected back from the surface of lens 156 to detector 154.

Unfortunately, the above design to tilt the beam suffers from some significant drawbacks. Most importantly, because of the large offset between lens 156 and emitter 152, system 150 takes up an undesirable amount of space. This limits the size of the various devices that can use these VCSEL assemblies.

BRIEF SUMMARY OF THE EMBODIMENTS

Embodiments of the present invention provide a Vertical Cavity Surface Emitting Laser (VCSEL) that can be configured to direct a beam of light emitted from the laser to a point offset from an optical axis of the laser. Additionally, embodiments of the present invention can also reduce the overall height of the VCSEL as configured to enable the apparatus to be used in low profile devices. In this manner, embodiments of the present invention can be used in low profile devices that cannot physically be built using prior art technology. Illustrative devices can include, by way of example and not limitation, optical mice, optical pens, paper sensors, and other devices that use small lasers to perform various functions.

In one embodiment, a VCSEL is disclosed that includes a chip containing a VCSEL active region that produces a laser beam on a first axis. The VCSEL can further include a post having a central axis therethrough. The central axis of the post can be offset a distance from the first axis. The VCSEL can further include a lens mounted on the post such that it bends or directs the laser beam away from the first axis.

In an alternate embodiment, a VCSEL is disclosed that includes a chip containing at least a first and a second VCSEL active region. The first VCSEL active if region produces a first laser beam on a first axis, while the second VCSEL active region produces a second laser beam on a second axis. The VCSEL can further include a post having a central axis therethrough. The central axis of the post can be offset from both of the first and second axes. The VCSEL can further include a lens mounted on the post such that the lens bends or directs the first and second laser beams away from the central axis. The lens can be designed to focus, collimate, or diverge the laser beam, as desired.

In both of the above embodiments, the post can be made from a photoresist material, including, but not limited to, SU-8 and Benzocyclobutene. The lens can be made from an optical epoxy that is deposited via ink jet or other manners onto the post. In some of the embodiments, the lens can be used to focus a portion of the laser beam(s) onto a photodiode or other optical receptor. These embodiments can be used in low profile devices that cannot physically be built using prior art technology. Illustrative devices can include, by way of example and not limitation, optical mice, optical pens, paper sensors, and other devices that use small lasers to perform various functions.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EMBODIMENTS

Embodiments of the present invention provide an apparatus that can direct a beam of light emitted from a laser to a point offset from an optical axis of the laser. Additionally, embodiments of the present invention can also reduce the overall height of the apparatus to enable the apparatus to be used in low profile devices. In this manner, embodiments of the present invention can be used in low profile devices that cannot physically be built using prior art technology. Illustrative devices can include, by way of example and not limitation, optical mice, optical pens, paper sensors, and other devices that use small lasers to perform various functions. Various embodiments of such an apparatus are discussed below.

Figure 1A:
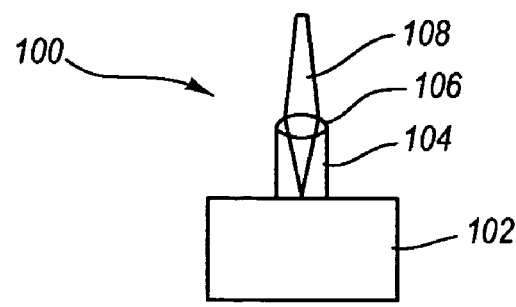
FIG. 1A illustrates a prior art example of a vertical cavity surface emitting laser (VCSEL) with a lens on the laser chip that directs the laser beam directly upward.
Figure 1B:
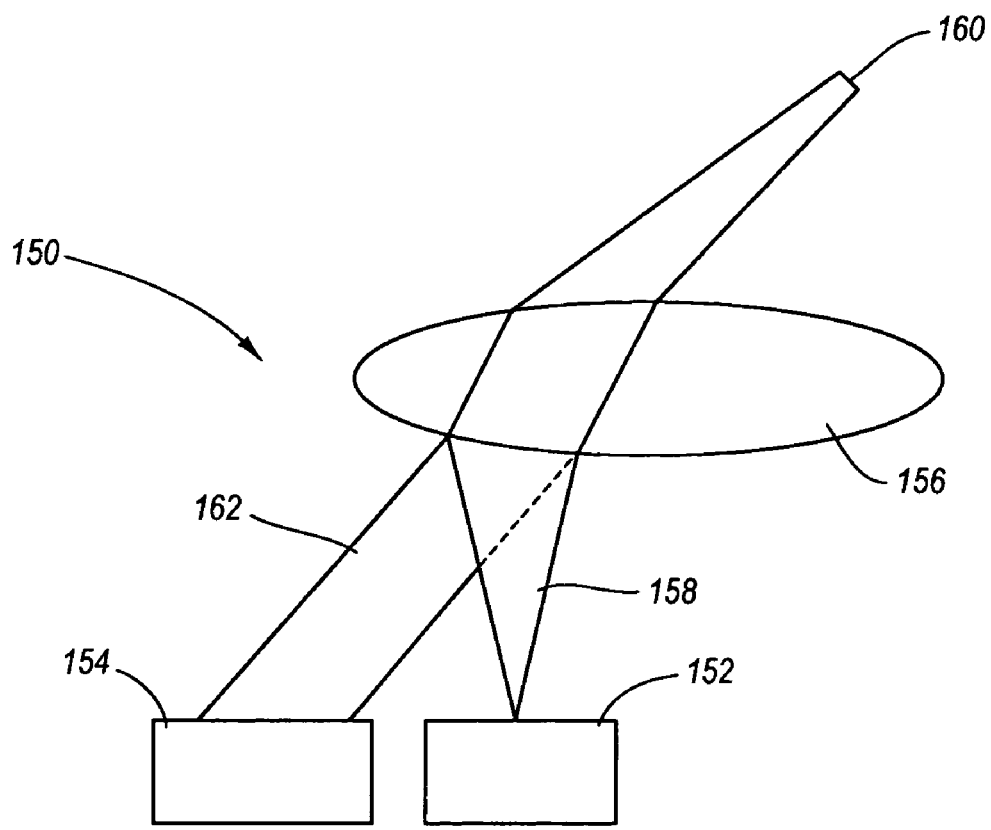
FIG. 1B illustrates one prior art apparatus for bending a light beam transmitted from a laser.
Figure 2A:
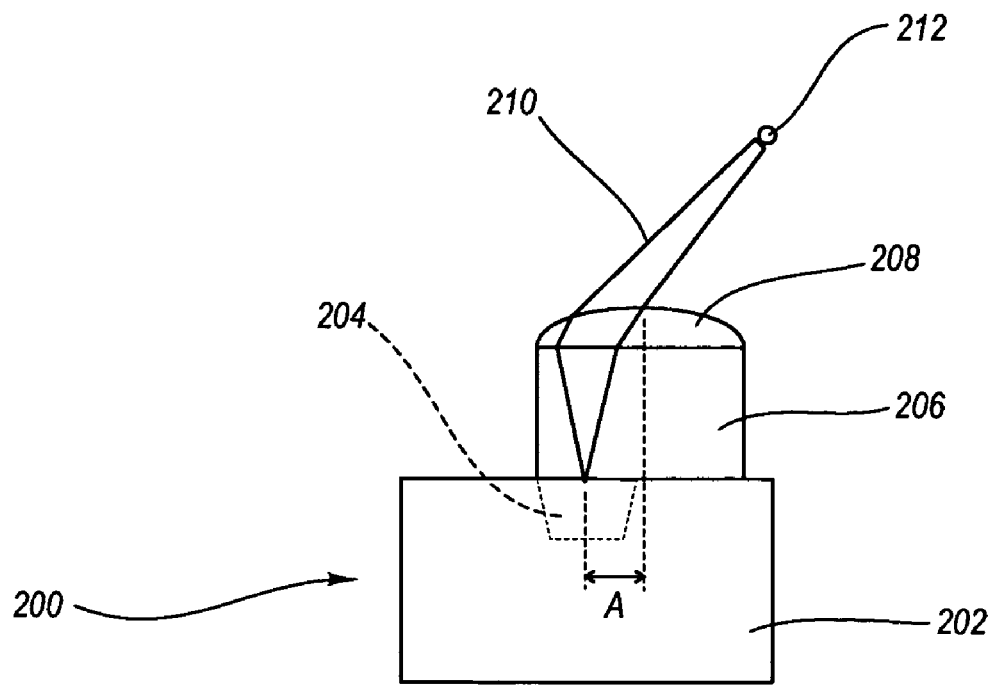
FIGS. 2A and 2B illustrate a side and top view, respectively, of one embodiment of a VCSEL according to the present invention.
Figure 2B:
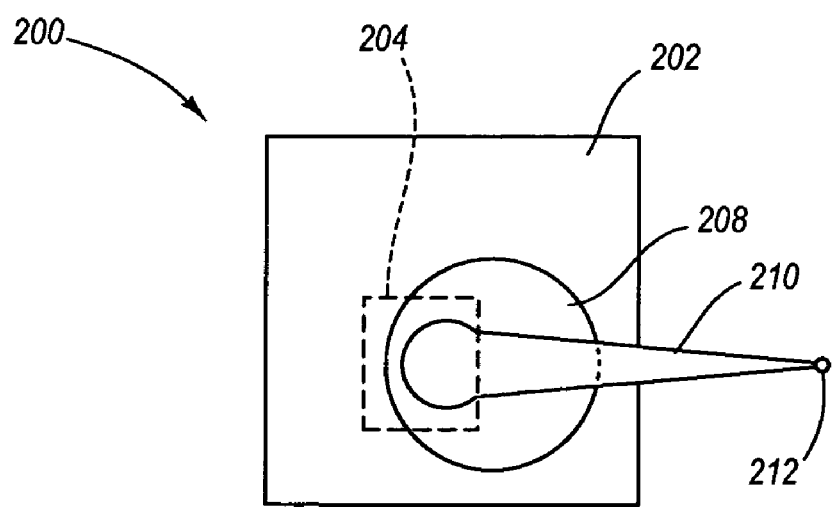

FIGS. 2A and 2B illustrate a side view and a top view, respectively, of one embodiment of a VCSEL 200 that can direct a laser beam generated by VCSEL 200 at an angle relative to an axis of the laser beam emitted from a laser emitter of VCSEL 200. This allows for a smaller overall package size than was available with the VCSEL shown in FIG. 1.

With continued reference to FIG. 2A, VCSEL 200 can include a chip 202 that contains a laser emitter 204. Mounted to chip 202 and optically communicating with laser emitter 204 is a standoff or post 206 that supports a lens 208. The standoff 206 facilitates propagation of a laser beam 210 emitted by laser emitter 204 to lens 208, while lens 208 directs laser beam 210 toward a point 212 offset from an axis of laser beam 210 emitted by laser emitter 204. In this manner, VCSEL 200 can direct laser beam 210 in a path "off axis" to a perpendicular to the surface of chip 202, without using optical components external to VCSEL 200. By so doing, VCSEL 200 provides a smaller overall package size than is currently available with the VCSEL shown in FIG. 1B, and provides greater variability in laser beam path than is capable with the VCSEL shown in FIG. 1A.

To aid with controlling the degree of bending or tilting of laser beam 210 relative to the perpendicular to the surface of chip 202, the lens/standoff combination is not centered directly over laser emitter 204, but is offset a distance from the center, the distance being identified as by reference "A". For instance, a longitudinal axis of standoff 206 and the central axis of lens 208 can be offset from an axis of laser beam 210 emitted from laser emitter 204 before laser beam 210 enters lens 208. This offset distance can be from 0 micrometers ($\mu$m) to about 200 $\mu$m, more preferably from about 50 $\mu$m to about 75 $\mu$m, or other distances outside the identified ranges. This offset allows a laser beam 210 transmitted from laser emitter 204 to be bent or directed at an angle from the perpendicular by lens 208, and focused to a point 212. The exact angle of the bend or tilt can depend on the height and shape of lens 208. In exemplary embodiments, this angle can be from about 10° to about 45° from the perpendicular, although other angles are possible. Further, although reference is made to lens 208 focusing the beam, it can be understood that in other configurations the lens can be designed to focus, collimate, or diverge the laser beam, as desired.

The specific direction of beam 210 shown in FIGS. 2A and 2B is arbitrary. As long as beam 210 is bent or tilted at an angle from the perpendicular, beam 210 can be directed to any point around a circumference of laser emitter 204 by placing standoff 206 and lens 208 in an appropriate position.

To reduce reflections and other undesirable optical effects, standoff 206 can be in physical contact with chip 202. In one exemplary embodiment, standoff 206 can be attached to chip 202 using, for example, an optically clear adhesive. Similarly, lens 208 can be in physical contact with polymer standoff 206. In one embodiment, lens 208 can be attached to polymer standoff 206 using, for example, an optically clear adhesive. In alternate embodiments, chip 202, polymer standoff 206, and lens 208 can be held in physical contact with each other using a frame or housing (not shown). In yet other alternate embodiments, chip 202, polymer standoff 206 and lens 208 can be optically aligned without being in physical contact with each other.

The standoff 206 and lens 208 can be fabricated from similar or dissimilar polymers. In one embodiment, standoff 206 can be fabricated from a photoresist material. A photoresist material can be defined as a light sensitive liquid or film, which, when selectively exposed to light and then developed, masks off an area based upon the configuration of a photomask positioned above the photoresist material. In one process, by way of example and not limitation, the photoresist material can be uniformly deposited on the surface of chip 202. A photomask can then be applied, and undesired portions of the photoresist material can be removed by exposing the photoresist material uncovered by the photomask to selected light or radiation, thus forming standoff 206 in a desired location on chip 202. In some embodiments, larger than normal chips can be fabricated to allow for an additional standoff distance. In some embodiments, the photoresist material can be SU-8, Benzocyclobutene (BCB), or other photoresist materials known to those of skill in the art.

Figure 3:
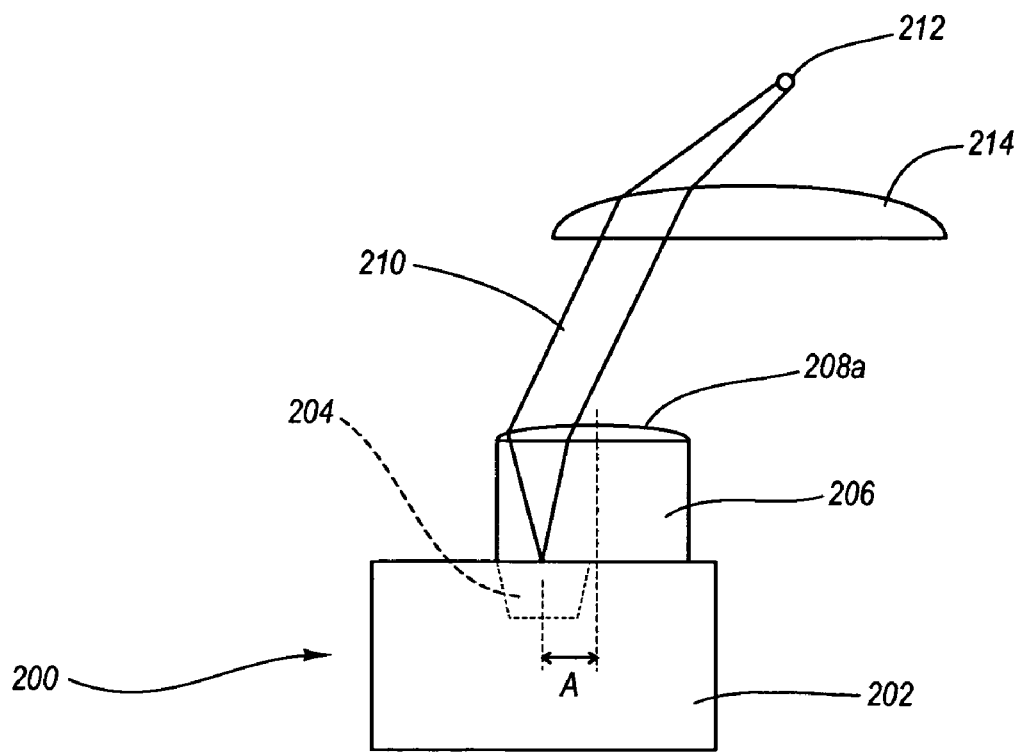
FIG. 3 illustrates a side view of an alternate construction of the embodiment of FIGS. 2A and 2B.

The lens 208 can be fabricated from, by way of example and not limitation, an optical epoxy. Once standoff 206 is formed on the surface of chip 202, a lithographic process, or other processes known to those of skill in the art, can be used to deposit the optical epoxy onto the top surface of standoff 206. In one embodiment, lens 208 can be formed by using an ink jet process to deposit the polymer on top of standoff 206. The specific shape of lens 208 can be determined by, among other things, operational considerations. For example, lens 208 can be designed to produce a converging beam 210, as shown in FIGS. 2A and 2B. Alternately, lens 208 can be designed to provide a collimating or diverging beam. In these cases, other external lenses or optical waveguides can be used to further direct beam 210. FIG. 3 illustrates one embodiment of the present invention in which a lens 208a collimates beam 210. Although reference is made to lens 208a collimating the beam, it can be understood that in other configurations the lens can be designed to focus, collimate, or diverge the laser beam, as desired.

VCSEL 200 can have various configurations to generate laser beam 210 by way of stimulated photonic emission. For instance, and not by way of limitation, VCSEL 200 can be an air post VCSEL, a buried re-growth VCSEL, or other types of VCSELs that incorporate a plurality of Distributed Bragg Reflectors (DBRs). Specific construction/manufacturing techniques for VCSELs are known to those of skill in the art. The VCSEL 200 can be operated at a wavelength of between about 650 nm and about 1500 nm. However, other wavelengths, both below and above this range, are also possible.

Similarly, the configuration of chip 202 can vary based upon the general functionality of VCSEL 200. VCSEL chips can, in general, be manufactured as a wafer of many chips that can then be cleaved into individual chips. As noted above, the specific dimensions of chip 202 can vary depending on the specific application, wavelength, and degree of offset of standoff 206. It is therefore understood that the specific illustrated embodiments provide examples only, and should not be construed to limit the invention in any way.

FIG. 3 illustrates an alternate exemplary embodiment of the VCSEL of FIG. 2. As with FIG. 2, FIG. 3 shows a VCSEL 200 that can include a chip 202 that contains a laser emitter 204. Mounted to chip 202 and optically communicating with laser emitter 204 is a standoff or post 206 that supports a lens 208a. The standoff 206 facilitates propagation of a laser beam 210 emitted by laser emitter 204 to lens 208a, while lens 208a collimates laser beam 210 and directs it towards an optional external lens 214. External lens 214 directs beam 210 to a point 212 offset from an axis of laser beam 210 emitted by laser emitter 204. In this manner, VCSEL 200 can direct laser beam 210 in a path "off axis" to a perpendicular to the surface of chip 202. By so doing, VCSEL 200 provides greater variability in laser beam path than is capable with the VCSEL shown in FIG. 1A.

To aid with controlling the degree of bending or tilting of laser beam 210 relative to the perpendicular to the surface of chip 202, the lens/standoff combination is not centered directly over laser emitter 204, but is offset a distance from the center, the distance being identified as by reference "A". For instance, a longitudinal axis of standoff 206 and the central axis of lens 208a are offset from an axis of laser beam 210 emitted from laser emitter 204 before laser beam 210 enters lens 208a. This offset distance can be from 0 micrometers (μm) to about 200 μm and more preferably from about 50 μm to about 75 μm. This offset allows a laser beam 210 transmitted from laser emitter 204 to be bent or directed at an angle from the perpendicular by lens 208a, and further directed at an angle by external lens 214. Lens 208a has a slightly different shape, and correspondingly different optical properties, than lens 208 of FIG. 2.

The specific direction of beam 210 shown in FIG. 3 is arbitrary. As long as beam 210 is directed or tilted at an angle from the perpendicular, beam 210 can be directed to any point around a circumference of laser emitter 204 by placing standoff 206, lens 208a, and external lens 214 in appropriate positions. The specific configuration of standoff 206, chip 202, and lens 208a is similar to the previous discussion with respect to FIGS. 2A and 2B.

Figure 4:
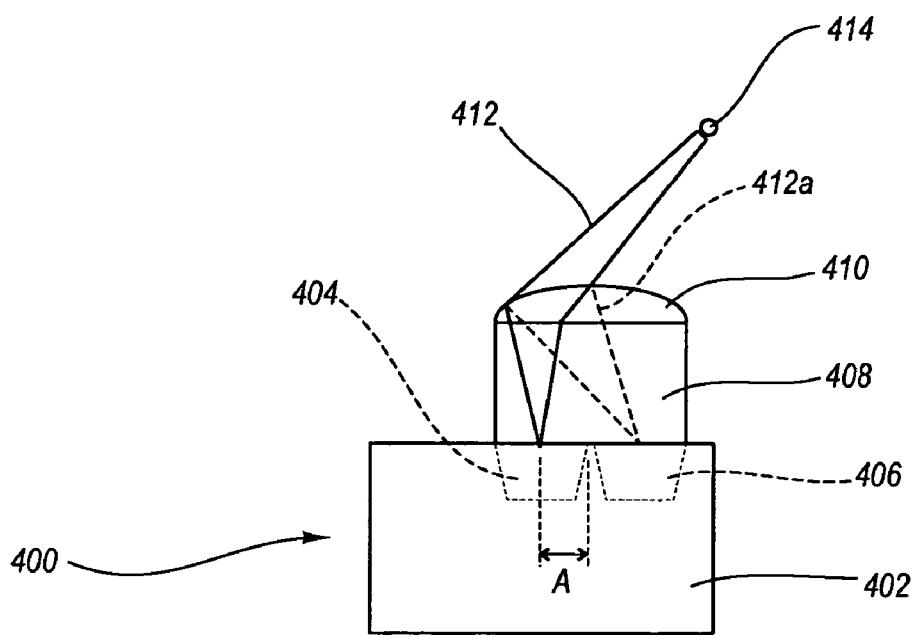
FIG. 4 illustrates a side view of an alternate embodiment of a VCSEL according to the present invention that includes a photodetector on the chip.

FIG. 4 illustrates an alternate embodiment of the present invention. In FIG. 4, a VCSEL 400 can include a chip 402 that contains a laser emitter 404. A photodiode 406 or other laser detector can also be located on chip 402. Mounted to chip 402 and optically communicating with laser emitter 404 is a standoff or post 408 that supports a lens 410. The standoff 408 facilitates propagation of a laser beam 412 emitted by laser emitter 404 to lens 410, while lens 410 directs laser beam 412 toward a point 414 offset from an axis of laser beam 412 emitted by laser emitter 404. In this manner, VCSEL 400 can direct laser beam 412 in a path "off axis" to a perpendicular to the surface of chip 402. By so doing, VCSEL 400 provides greater variability in laser beam path than is capable with the VCSEL shown in FIG. 1A. The ranges of offset distances of lens 410 and the angles of beam 412 as it exits lens 410 can be the same as those discussed above with respect to FIGS. 2A and 2B. Further, although reference is made to lens 410 focusing the beam to a particular point, it can be understood that in other configurations the lens can be designed to focus, collimate, or diverge the laser beam, as desired.

The photodiode 406 measures a portion of beam 412 that is reflected from lens 410 as beam 412a. Photodiode 406 allows an operator to monitor the laser power from laser 404. In some embodiments, this power can then be adjusted according to operational requirements to more effectively control operation of laser 404.

Figure 5A:
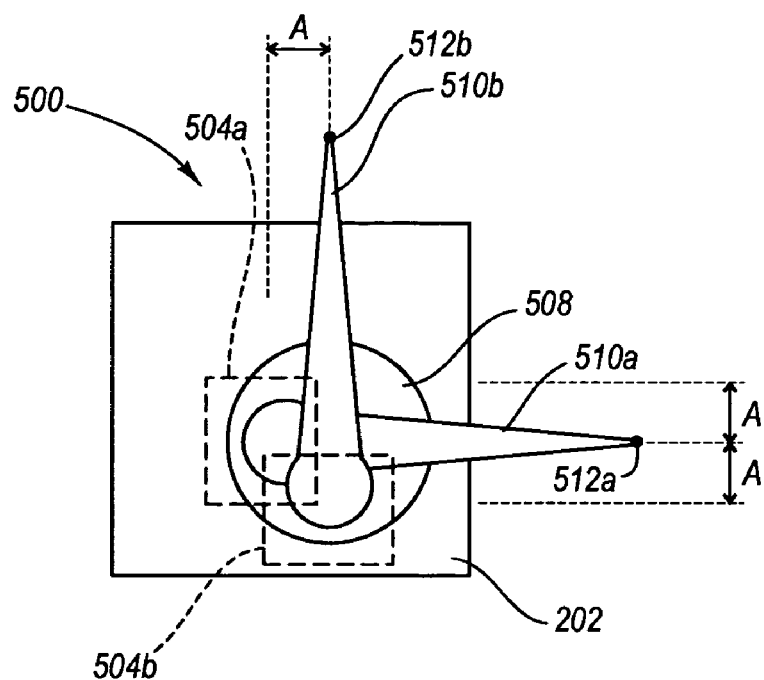
FIGS. 5A and 5B illustrate additional alternate embodiments incorporating multiple VCSEL active regions on a single chip.

While the exemplary embodiments shown in FIGS. 2-4 illustrate a chip with only one active VCSEL region, multiple active VCSEL regions are also possible. One exemplary embodiment of a laser chip having multiple active VCSEL regions is shown in FIG. 5A, and designated generally as reference numeral 500. As with the previous embodiments, laser 500 can include a chip 502. However, in this exemplary embodiment, chip 502 can now include two laser emitters 504a and 504b. Emitters 504a, 504b correspond to two active VCSEL regions on the single chip 502. Emitters 504a, 504b can be operated on the same or different frequencies.

Mounted to chip 502 and optically communicating with laser emitters 504a and 504b is a standoff or post (not shown in this view) that supports a lens 508. The standoff facilitates propagation of a laser beam 510a emitted by laser emitter 504a and a laser beam 510b emitted by laser 504b, to lens 508. Lens 508 directs both laser beams 510a, 510b toward a point 512a, 512b respectively, offset from an axis of laser beams 510a, 510b emitted by laser emitters 504a, 504b.

In this manner, VCSEL 500 can direct both laser beams 510a, 510b in a path "off axis" to a perpendicular to the surface of chip 502, without using optical components external to VCSEL 500. By so doing, VCSEL 500 provides a smaller overall package size than is currently available with the VCSEL shown in FIG. 1B, and provides greater variability in laser beam path than is capable with the VCSEL shown in FIG. 1A. Additionally, since two laser beams 510a, 510b are used, this exemplary embodiment allows laser 500 to be used in a device that can discriminate between motion in a first direction and motion in a second direction. Such devices can include, by way of example and not limitation, optical mice, optical pens, paper sensors, etc.

To aid with controlling the degree of bending or tilting of laser beams 510a, 510b relative to the perpendicular to the surface of chip 502, the lens/standoff combination is not centered directly over laser emitters 504a, 504b, but is offset a distance from the center, the distance being identified as by reference "A". In one exemplary embodiment, the lasers 504a, 504b and lens 508 can be spaced such that the offset distance "A" between lasers 504a, 504b and the center of lens 508 are the same. In alternate embodiments, the offset distance can be different for each laser emitter 504a, 504b.

This offset allows a laser beam 510a transmitted from laser emitter 504a, and a laser beam 510b transmitted from laser emitter 504b, to be bent at an angle from the perpendicular by lens 508. In exemplary embodiments, this angle can be from about 10° to about 45° from the perpendicular, although other angles above or below those identified are possible. In one exemplary embodiment, the angle is about 45° from the perpendicular for each beam. The specific direction of the beams shown in FIG. 5A is arbitrary. As long as each beam 510a, 510b is bent at an angle from the perpendicular, the beam can be directed to any point around a circumference of chip 502 by placing the polymer standoff and lens 508 in an appropriate position. However, there is an advantage in having the beams 510a, 510b perpendicular to each other. When the beams are perpendicular to each other, laser 500 can be used to decode movement in both an x and a y direction. This is very useful in, by way of example and not limitation, an optical mouse application.

In some embodiments, it is possible to direct both beams 510a, 510b to a single point, such as, by way of example and not limitation, an optical fiber. In this case, beams 510a and 510b would be operated on different frequencies so that they could be coupled into the same fiber.

Figure 5B:
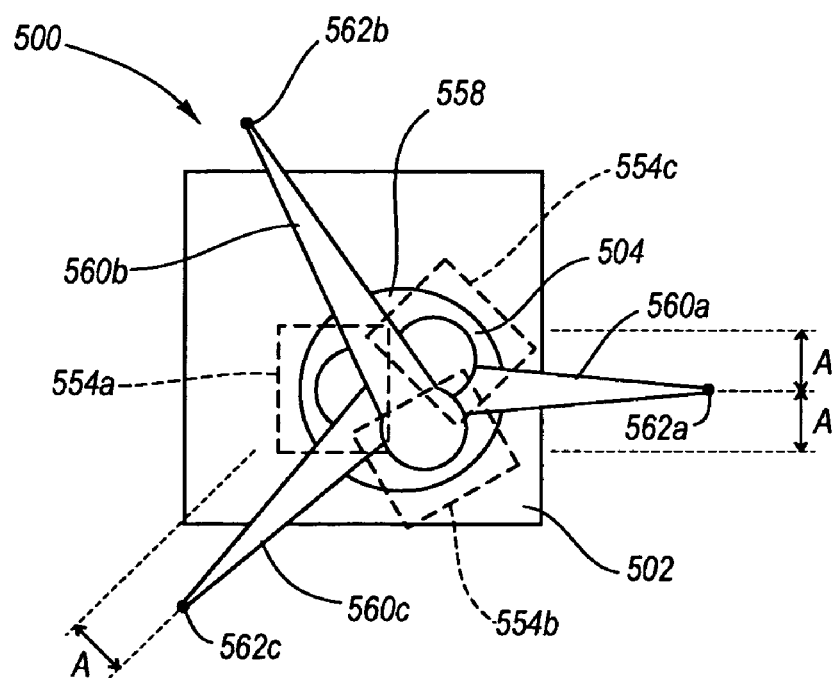

Another alternate exemplary embodiment of a laser with multiple active regions is shown in FIG. 5B, and designated generally as reference numeral 550. As with the previous embodiments, laser 550 can include a chip 552. However, chip 552 can now include three laser emitters 554a, 554b and 554c. Emitters 554a, 554b, and 554c correspond to three active VCSEL regions on the single chip 552. Mounted to chip 552 and optically communicating with laser emitters 554a, 554b and 554c is a standoff (not shown in this view) that supports a lens 558. The standoff facilitates propagation of a laser beam 560a emitted by laser emitter 554a, a laser beam 560b emitted by laser 554b, and a laser beam 560c emitted by laser 554c, to lens 558. Lens 558 directs all three laser beams 560a, 560b, and 560c toward a point 562a, 562b, 562c respectively, offset from an axis of laser beams 560a, 560b and 560c emitted by laser emitters 554a, 554b and 554c, respectively. As with the previous embodiments, lens 558 can be used to focus, collimate or diverge beams 560a, 560b and 560c.

In this manner, VCSEL 550 can direct all three laser beams 560a, 560b, 560c in a path "off axis" to a perpendicular to the surface of chip 552, without using optical components external to VCSEL 550. By so doing, VCSEL 550 provides a smaller overall package size than is currently available with the VCSEL shown in FIG. 1B, and provides greater variability in laser beam path than is capable with the VCSEL shown in FIG. 1A. Additionally, since three laser beams 560a, 560b, and 560c are now used, this exemplary embodiment allows laser 550 to be used in a device that can discriminate between motions in three different directions. Such devices can include, by way of example and not limitation, optical mice, optical pens, laser scanners used in CD drives, DVD drives, etc. Likewise, as with the embodiment illustrated in FIG. 5A, all three of the beams can be operated on different frequencies and/or directed to a single point, such as an optical fiber.

To aid with controlling the degree of bending or tilting of laser beams 560a, 560b, 560c relative to the perpendicular to the surface of chip 552, the lens/standoff combination is not centered directly over laser emitters 554a, 554b, 554c but is offset a distance from the center, the distance being identified by reference "A". In one exemplary embodiment, the lasers 554a, 554b, 554c and lens 558 can be spaced such that the offset distance "A" between lasers 554a, 554b, 554c and the center of lens 558 are the same. In alternate embodiments, the offset distance can be different for each laser emitter 554a, 554b, 554c. In yet other alternate embodiments, the offset distance can be the same for two of the emitters, and different for the third.

This offset allows a laser beam 560a transmitted from laser emitter 554a, a laser beam 560b transmitted from laser emitter 554b, and a laser beam 560c transmitted from laser emitter 554c, to be bent at an angle from the perpendicular by lens 558. In exemplary embodiments, this angle can be from about 10° to about 45° from the perpendicular, although other angles above or below those identified are possible. In one embodiment, the angle is about 45° from the perpendicular for each beam. However, different angles for each beam are also possible. The specific direction of the beams shown in FIG. 5B is arbitrary. As long as each beam 560a, 560b and 560c is bent at an angle from the perpendicular, the beam can be directed to any point around a circumference of chip 552 by placing the polymer standoff and lens 558 in an appropriate position.

The embodiments of FIGS. 2A, 2B, 4, 5A and 5B provide the advantage that shorter distances are required to focus the laser beam onto a desired surface. By way of example and not limitation, the overall package height for a package that can use the exemplary embodiments can be less than about 2 mm. In alternate exemplary embodiments, the package height can be 1.5 mm or less. This facilitates the use of these embodiments in low profile devices that cannot physically be built using prior art technology. Such devices can include, by way of example and not limitation, an optical mouse, an optical pen, paper sensors, and other devices that use small lasers to perform various functions.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical device comprising:
   a chip containing at least one laser active region that generates a laser beam propagating in a first direction and having a first optical axis;
   a polymeric post positioned on said chip;
   a lens mounted on said post, said lens being positioned along a second optical axis to direct said laser beam away from said first direction;
   wherein said lens is configured to direct at least a portion of said laser beam to a monitor photodiode formed in the chip containing the at least one active region;
   the monitor photodiode being positioned in the chip relative to the lens so as to receive a portion of light from the VCSEL that reflects off the lens; and
   wherein the chip, the post, and the lens have an overall package height of less than 2 mm.

2. The optical device of claim 1 wherein said post comprises a photoresist material.

3. The optical device of claim 2, wherein said photoresist material comprises SU-8 or Benzocyclobutene.

4. The optical device of claim 1, wherein said lens comprises an optical epoxy and wherein said lens is configured to perform any one of focusing, collimating or diverging said laser beam.

5. The optical device of claim 1, wherein said monitor photodiode is used to adjust an optical power of said laser beam.

6. An optical device comprising:
   a chip containing a Vertical Cavity Surface Emitting Laser (VCSEL) active region that produces a laser beam on a first axis;

a post having a central axis therethrough, said central axis being offset a first distance from said first axis, said post being mounted on said chip;

a lens mounted on said post, said first lens being configured to direct said laser beam away from said first axis;

a monitor diode formed in the chip containing the VCSEL active region, the monitor photodiode being positioned in the chip relative to the lens so as to receive a portion of light from the active region that reflects off the lens; and wherein the chip, the post, and the lens have an overall package height of less than 2 mm.

7. The optical device of claim 6, wherein said post comprises a photoresist material.

8. The optical device of claim 7, wherein said photoresist material comprises one of SU-8 and Benzocyclobutene.

9. The optical device of claim 6, wherein said lens comprises an optical epoxy and wherein said lens is configured to perform any one of focusing, collimating or diverging said laser beam.

10. The optical device of claim 6, wherein said first lens is configured to direct at least a portion of said laser beam to a monitor photodiode and wherein said monitor photodiode can be used to adjust an optical power of said laser beam.

11. An optical device comprising:

a chip containing at least a first and a second Vertical Cavity Surface Emitting Laser (VCSEL) active region, said first VCSEL active region being configured to produce a first laser beam on a first axis, said second VCSEL active region being configured to produce a second laser beam on a second axis;

a polymeric post having a central axis therethrough, said central axis being offset from said first and second axes, said post being adjacent to said chip; and a lens mounted on said post, said lens being configured to bend said first and second laser beams away from said central axis;

a monitor diode formed in said chip containing a first and second VCSEL active regions, the monitor diode being positioned in the chip relative to the lens so as to receive a portion of the light from the first and second active regions that reflects off the lens; and wherein the chip, the post, and the lens have an overall package height of less than 2 mm.

12. The optical device of claim 11, wherein said post comprises a photoresist material, said photoresist material comprising one of SU-8 and Benzocyclobutene.

13. The optical device of claim 11, wherein said lens comprises an optical epoxy and wherein said lens is configured to perform any one of focusing, collimating or diverging each of said laser beams.

14. The optical device of claim 11, wherein said first and second laser beams are orthogonal to each other after being bent by said lens.

15. The optical device of claim 11, further comprising a third VCSEL active region that is configured to produce a third laser beam on a third optical axis, said third optical axis being offset from said central axis.

16. The optical device of claim 15, wherein said first, second, and third laser beams are at approximately 120° relative to each other after being bent by said lens.

17. The optical device of claim 11, wherein said lens directs at least a portion of at least one of said laser beams to a monitor photodiode.

18. The optical device of claim 15, wherein said first, second and third VCSEL active regions can be operated simultaneously.

19. The optical device of claim 1, further comprising an adhesive between said lens and said post.

20. The optical device of claim 1, wherein said lens comprises an epoxy.

21. The optical device of claim 1, wherein said lens is configured to direct said laser beam away from said first direction by an angle of about 10°.

22. The optical device of claim 1, wherein said lens is configured to direct said laser beam away from said first direction by an angle of about 45°.

23. The optical device of claim 1, wherein the overall package height is less than 1.5 mm.

24. The optical device of claim 6, wherein the overall package height is less than 1.5 mm.

25. The optical device of claim 11, wherein the overall package height is less than 1.5 mm.

* * * * *

UNITED STATES PATENT AND TRADEMARK OFFICE
CERTIFICATE OF CORRECTION

PATENT NO.        : 7,460,578 B2                                        Page 1 of 2
APPLICATION NO.   : 11/103277
DATED             : December 2, 2008
INVENTOR(S)       : Guenter It is certified that error appears in the above-identified patent and that said Letters Patent is hereby corrected as shown below:

Drawings
Please replace the current drawing of Fig. 5A with the figure depicted below in which the chip --502-- is correctly labeled.

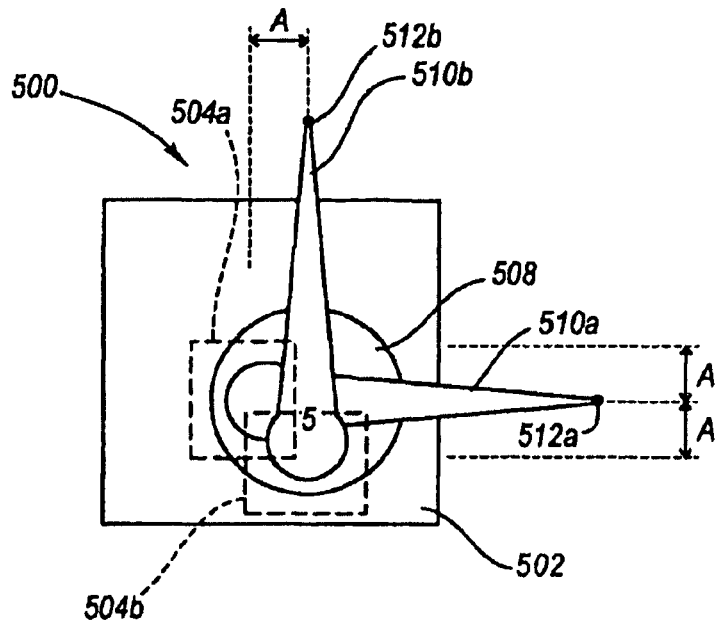

Fig. 5A

Signed and Sealed this

Nineteenth Day of October, 2010

David J. Kappos
Director of the United States Patent and Trademark Office

CERTIFICATE OF CORRECTION (continued)
U.S. Pat. No. 7,460,578 B2

Drawings
Please replace the current drawing of Fig. 5B with the figure depicted below in which the chip --552-- and laser --550-- are correctly labeled.

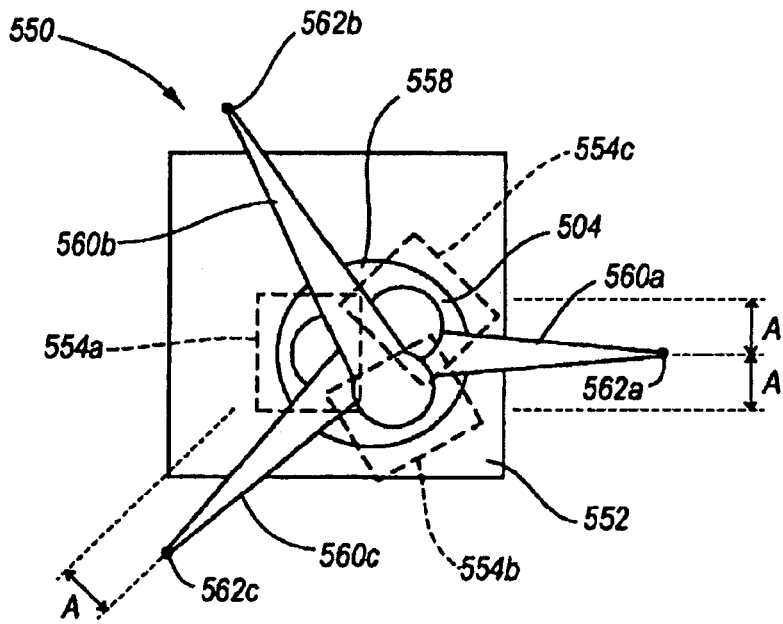

Fig. 5B

Column 1
Line 56, change "emitter detector" to --emitter/detector--

Column 2
Line 37, delete "if"

Column 7
Lines 60 and 62, change "lasers" to --laser emitters--